(12) United States Patent
Hopkins et al.

(10) Patent No.: US 9,188,638 B2
(45) Date of Patent: Nov. 17, 2015

(54) FUNCTIONAL TESTING OF AN INTEGRATED CIRCUIT CHIP

(71) Applicant: UltraSoC Technologies Ltd, Cambridge (GB)

(72) Inventors: Andrew Brian Thomas Hopkins, Folkestone (GB); Iain Craig Robertson, Cople (GB); Michael Jonathan Thyer, Cambridge (GB)

(73) Assignee: UltraSoC Technologies Ltd., Cambridge (GB)

( * ) Notice: Subject to any disclaimer, the term of this patent is extended or adjusted under 35 U.S.C. 154(b) by 0 days.

(21) Appl. No.: 14/251,044

(22) Filed: Apr. 11, 2014

(65) Prior Publication Data

US 2015/0226801 A1    Aug. 13, 2015

(30) Foreign Application Priority Data

Feb. 12, 2014 (GB) .................................. 1402392.3

(51) Int. Cl.
*G01R 31/317* (2006.01)
*G01R 31/3177* (2006.01)

(52) U.S. Cl.
CPC ...... *G01R 31/31725* (2013.01); *G01R 31/3177* (2013.01)

(58) Field of Classification Search
CPC .................... G01R 31/31725; G01R 31/3177; G01R 31/31705; G01R 31/31709; G01R 31/318544; G06F 11/24
USPC .................................................. 714/744, 745
See application file for complete search history.

(56) References Cited

U.S. PATENT DOCUMENTS

| | | | |
|---|---|---|---|
| 5,956,289 A * | 9/1999 | Norman et al. ............. | 365/233.1 |
| 7,102,402 B2 * | 9/2006 | Kurd et al. .................... | 327/158 |
| 7,240,303 B1 * | 7/2007 | Schubert et al. ............. | 716/106 |
| 7,506,233 B2 * | 3/2009 | Yamada ........................ | 714/731 |
| 7,900,113 B2 * | 3/2011 | Hunt et al. .................... | 714/744 |
| 8,032,778 B2 * | 10/2011 | Lin ................................ | 713/500 |
| 8,072,253 B2 * | 12/2011 | Kaeriyama et al. ........... | 327/231 |
| 8,127,157 B2 * | 2/2012 | Bilak ............................ | 713/300 |
| 8,159,241 B1 * | 4/2012 | Jaarsma .................... | 324/750.03 |

(Continued)

OTHER PUBLICATIONS

Kaeriyama, S.; Kajita, M.; Mizuno, M., "A 1-to-2GHz 4-Phase On-Chip Clock Generator with Timing-Margin Test Capability," Solid-State Circuits Conference, 2007. ISSCC 2007. Digest of Technical Papers. IEEE International , vol., No., pp. 174,594, Feb. 11-15, 2007.*

(Continued)

*Primary Examiner* — Cynthia Britt
(74) *Attorney, Agent, or Firm* — Vorys, Sater, Seymour and Pease LLP; Vincent M DeLuca

(57) ABSTRACT

A method of functionality testing system circuitry on an integrated circuit chip, the system circuitry comprising a plurality of sub-circuits and the integrated circuit chip further comprising debugging circuitry, the debugging circuitry comprising variability circuitry. The method comprises: at the system circuitry, performing a function by the sub-circuits performing concurrent actions; at the variability circuitry, altering relative timing of the concurrent actions so as to increase the likelihood of one or more errors in the system circuitry's performance of the function; and at the debugging circuitry, recording one or more errors in the system circuitry's performance of the function.

18 Claims, 5 Drawing Sheets

(56) References Cited

U.S. PATENT DOCUMENTS

| 8,423,850 B2* | 4/2013 | Iwata et al. ............ 714/742 |
|---|---|---|
| 2003/0005360 A1* | 1/2003 | West et al. ............ 714/25 |
| 2004/0216005 A1 | 10/2004 | Pramanick et al. |
| 2011/0022909 A1* | 1/2011 | Wang et al. ............ 714/726 |

OTHER PUBLICATIONS

Mingjing Chen; Orailoglu, A., "On Diagnosis of Timing Failures in Scan Architecture," Computer-Aided Design of Integrated Circuits and Systems, IEEE Transactions on , vol. 31, No. 7, pp. 1102,1115, Jul. 2012.*

Saadatmand, M.; Sjodin, M., "Testing of Timing Properties in Real-Time Systems: Verifying Clock Constraints," Software Engineering Conference (APSEC, 2013 20th Asia-Pacific , vol. 2, No., pp. 152,158, Dec. 2-5, 2013.*

Susa, T.; Murakawa, M.; Takahashi, E.; Furuya, T.; Higuchi, T., "Post-Fabrication Clock-Timing Adjustment for Digital LSIs Ensuring Operational Timing Margins," Hybrid Intelligent Systems, 2008. HIS '08. Eighth International Conference on , vol., No., pp. 907,910, Sep. 10-21, 2008.*

Furuichi, S.; Ueda, Y.; Wadatt, A.; Takahashi, E.; Murakawa, M.; Susa, T.; Higuchi, T., "A low-power DCT chip utilizing post-fabrication clock-timing adjustment with area reductions and adjustment speed enhancements," Solid-State Circuits Conference, 2007. ASSCC '07. IEEE Asian , vol., No., pp. 268,271, Nov. 12-14, 2007.*

Application No. GB1402392.3 Search Report under Section 17 dated Feb. 27, 2014 and Combined Search and Examination Report under Sections 17 and 18(3) dated Feb. 28, 2014.

* cited by examiner

US 9,188,638 B2

FUNCTIONAL TESTING OF AN INTEGRATED CIRCUIT CHIP

BACKGROUND

This disclosure relates to debugging circuitry on an integrated circuit chip. The disclosure is particularly relevant to functionally testing circuitry on an operational integrated circuit chip.

In the past, an embedded system which had multiple core devices (processors, memories etc.) would have been incorporated onto a Printed Circuit Board (PCB) and connected on the PCB via buses. Traffic in the embedded system was conveyed over these buses. This arrangement was convenient for debugging the core devices, because debugging tools such as oscilloscopes and logic analyzers could be attached to the PCB's buses allowing direct access to the core devices.

Market demand for smaller products coupled with advances in semiconductor technology has led to the development of System-on-Chip (SoC) devices. In a SoC, the multiple core devices of an embedded system are integrated onto a single chip. In a SoC, the traffic in the embedded system is conveyed over internal buses, thus connection of debugging tools directly to the system bus is no longer possible. The resulting reduced access coupled with an increasing quantity of data being transported around the chip (due to developments of SoC technology leading to integration of multiple processing cores and higher internal clocking frequencies), has reduced the ability of external debugging tools to find and solve bugs within the system in the timescales demanded by the industry.

These days, two types of testing are commonly performed to identify problems with a SoC device prior to it being placed on the market. The first type of test is known as Design for Test (DfT). DfT is implemented on a chip which is operating in a dedicated test mode. This dedicated test mode is mutually exclusive to the end-use functional mode which the chip operates in the final application product. The purpose of the DfT is to determine if the chip hardware has been manufactured correctly, and to identify any problems if it has not. DfT does not, and is not capable of, testing the operational functionality of the chip. In other words, DfT does not, and is not capable of, testing the functionality of the chip whilst the chip is operating in its end-use functional mode.

The second type of test is known as functional testing. Due to the problems outlined above, functional testing of an embedded system is generally done in a simulation environment. A function is simulated and functional coverage software used to record the outcome. The outcome is then reviewed to determine if the system correctly carried out the function. A problem with simulation environments for hardware circuits is that they are extremely slow compared to the SoC hardware operating in normal conditions (about $\frac{1}{10,000,000}$). Thus, functional testing run in simulation environments does not detect timing-related bugs which surface when the SoC is operating at full speed. Additionally, simulation environments tend to simulate each function in isolation. This does not reflect the system's operation of the function in the final application product, where the system will be performing other functions at the same time. Thus, in the final product, the system resource available to the tested function will be less. For example, the system may have to wait to access a bus or memory in order to carry out part of the function. Thus, functional testing run in simulation environments does not detect system resource-related bugs which surface when the SoC is operating in normal conditions in the final application product.

Consequently, once a SoC is released to the market, and being operated at full-speed under normal conditions, bugs surface which were not detected during the functional testing process.

Thus, there is a need for improved functional testing of SoC devices.

SUMMARY OF THE INVENTION

According to a first aspect of this disclosure, there is provided an integrated circuit chip comprising: system circuitry configured to perform a function, the system circuitry comprising a plurality of sub-circuits configured to perform the function by performing concurrent actions; debugging circuitry configured to detect one or more errors in the system circuitry's performance of the function, the debugging circuitry comprising variability circuitry; wherein the debugging circuitry is configured to functionally test the system circuitry by: at the variability circuitry, altering relative timing of the concurrent actions so as to increase the likelihood of one or more errors in the system circuitry's performance of the function; and recording one or more errors.

The variability circuitry may be configured to alter the relative timing of the concurrent actions by applying jitter to the timing of the concurrent actions.

The variability circuitry may be configured to alter the relative timing of the concurrent actions by applying a delay to occurrences of a particular action of the concurrent actions.

Suitably, the system circuitry comprises a clock, and the variability circuitry is configured to alter the relative timing of the concurrent actions by modifying the frequency or phase of the clock output. For example, the system circuitry may comprise clock gating circuitry at an output of the clock, and the variability circuitry may be configured to modify the frequency of the clock output by controlling the clock gating circuitry to delete clock pulses output from the clock.

Suitably, the system circuitry comprises interconnect circuitry, and the sub-circuits are configured to perform the concurrent actions by communicating signals on the interconnect circuitry, and the variability circuitry is configured to alter the relative timing of the concurrent actions by intercepting or delaying the signals on the interconnect circuitry.

The variability circuitry may be configured to alter the relative timing of the concurrent actions by applying an error to one or more of the concurrent actions.

The system circuitry may comprise a cache, and the sub-circuits may be configured to perform the concurrent actions using the cache, and the variability circuitry may be configured to alter the relative timing of the concurrent actions by invalidating cache lines of the cache.

Suitably, the system circuitry comprises a processor, and the variability circuitry is configured to alter the relative timing of the concurrent actions by stopping the processor for a time duration.

Suitably, the debugging circuitry is configured to functionally test the system by: causing the system circuitry to repeatedly perform the function; and at the variability circuitry, on each repeat performance of the function, altering the relative timing of the concurrent actions such that the likelihood of one or more errors in the system circuitry's performance of the function is higher than that likelihood for the last repeat performance of the function; and recording one or more errors.

The debugging circuitry may be configured to determine minimum system resources required by the system circuitry in order to perform the function in dependence on the functional test.

Suitably, the variability circuitry is configured to alter the relative timing of the concurrent actions under the control of a debug controller.

The variability circuitry may be configured to alter the relative timing of the concurrent actions in response to debug events occurring on the integrated circuit chip.

The variability circuitry may comprise a counter for altering the relative timing of the concurrent actions.

The variability circuitry may comprise a linear-feedback shift register for altering the relative timing of the concurrent actions.

The variability circuitry may comprise a pseudo-random number generator for altering the relative timing of the concurrent actions.

According to a second aspect of this disclosure, there is provided a method of functionality testing system circuitry on an integrated circuit chip, the system circuitry comprising a plurality of sub-circuits and the integrated circuit chip further comprising debugging circuitry, the debugging circuitry comprising variability circuitry, the method comprising: at the system circuitry, performing a function by the sub-circuits performing concurrent actions; at the variability circuitry, altering relative timing of the concurrent actions so as to increase the likelihood of one or more errors in the system circuitry's performance of the function; and at the debugging circuitry, recording one or more errors in the system circuitry's performance of the function.

The method may comprise altering the relative timing of the concurrent actions by applying jitter to the timing of the concurrent actions.

The method may comprising altering the relative timing of the concurrent actions by applying a delay to occurrences of a particular action of the concurrent actions.

The delay may be of a fixed length. The delay may be of a variable length.

The delay may be applied to every occurrence of the particular action of the concurrent actions. The delay may be applied to a proportion of the occurrences of the particular action of the concurrent actions.

The method may comprise altering the relative timing of the concurrent actions by modifying the output frequency or phase of a clock of the system circuitry. For example, the method may comprise modifying the output frequency of the clock by controlling clock gating circuitry at an output of the clock to delete clock pulses output from the clock.

Suitably, the method comprises altering the relative timing of the concurrent actions by intercepting or delaying the signals on interconnect circuitry.

The method may comprise altering the relative timing of the concurrent actions by applying an error to one or more of the concurrent actions.

The method may comprise altering the relative timing of the concurrent actions by invalidating cache lines of a cache.

The method may comprises altering the relative timing of the concurrent actions by stopping a processor for a time duration.

Suitably, the method comprises at the system circuitry, repeatedly performing the function; at the variability circuitry, on each repeat performance of the function, altering the relative timing of the concurrent actions such that the likelihood of one or more errors in the system circuitry's performance of the function is higher than that likelihood for the last repeat performance of the function; and at the debugging circuitry, recording one or more errors.

Suitably, the method comprises determining minimum system resources required by the system circuitry in order to perform the function in dependence on the functional test.

The method may comprise altering the relative timing of the concurrent actions under the control of a debug controller.

The method may comprise altering the relative timing of the concurrent actions in response to debug events occurring on the integrated circuit chip.

BRIEF DESCRIPTION OF THE DRAWINGS

The present disclosure will now be described by way of example with reference to the accompanying drawings. In the drawings.

DETAILED DESCRIPTION

The following disclosure describes a debug architecture suitable for implementation on a SoC. The debug architecture enables functional testing and validation of the whole SoC at full-speed and under the normal operating conditions of the chip in the final application product.

The functional testing referred to herein is performed on the integrated circuit chip to be tested, not in a simulation or emulation environment. The functional testing is performed by a debugging architecture integrated onto the integrated circuit chip. The functional testing is performed when the chip is operating in its functional mode. The functional mode is the mode that the chip operates in the final application product. In other words, in the functional mode, the chip is operational to carry out the functionality that it was designed to perform. The functional testing may be performed by stimulating system circuitry to perform the functions of the test, and debugging circuitry monitoring the system circuitry's performance of the function. Alternatively, functional testing may be performed by debugging circuitry monitoring the system circuitry's performance of a function as and when that function is implemented by the system circuitry in the functional mode. In other words, in this second case, a debug controller does not expressly stimulate the system circuitry to perform the function. The functional mode is different to a test mode used during WT. The debugging architecture described herein is not configured to functionally test the integrated circuit chip in a dedicated test mode.

Figure 1:
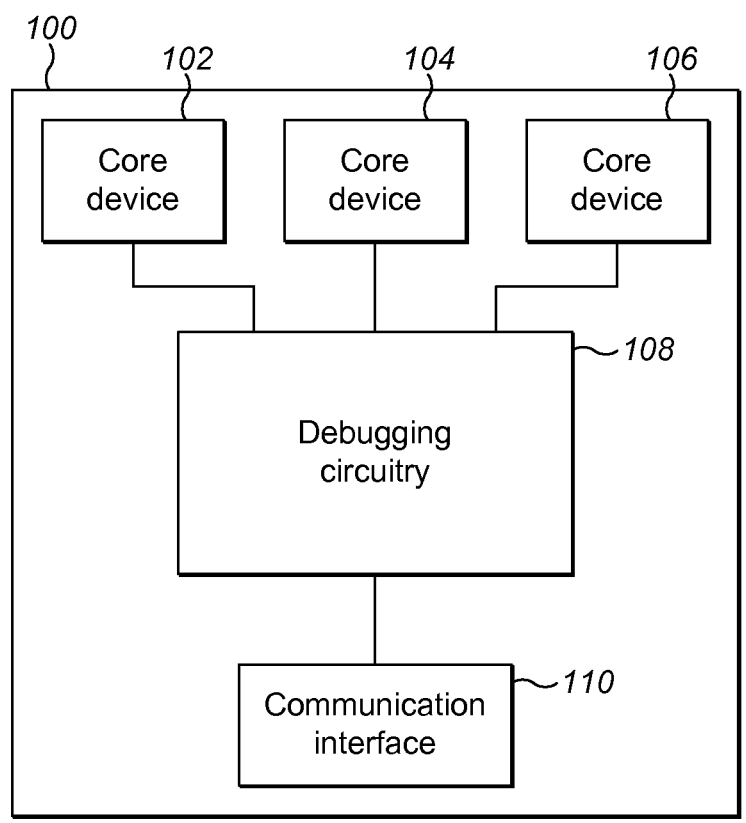
FIG. 1 is a schematic drawing of an exemplary debug architecture.
Figure 2:
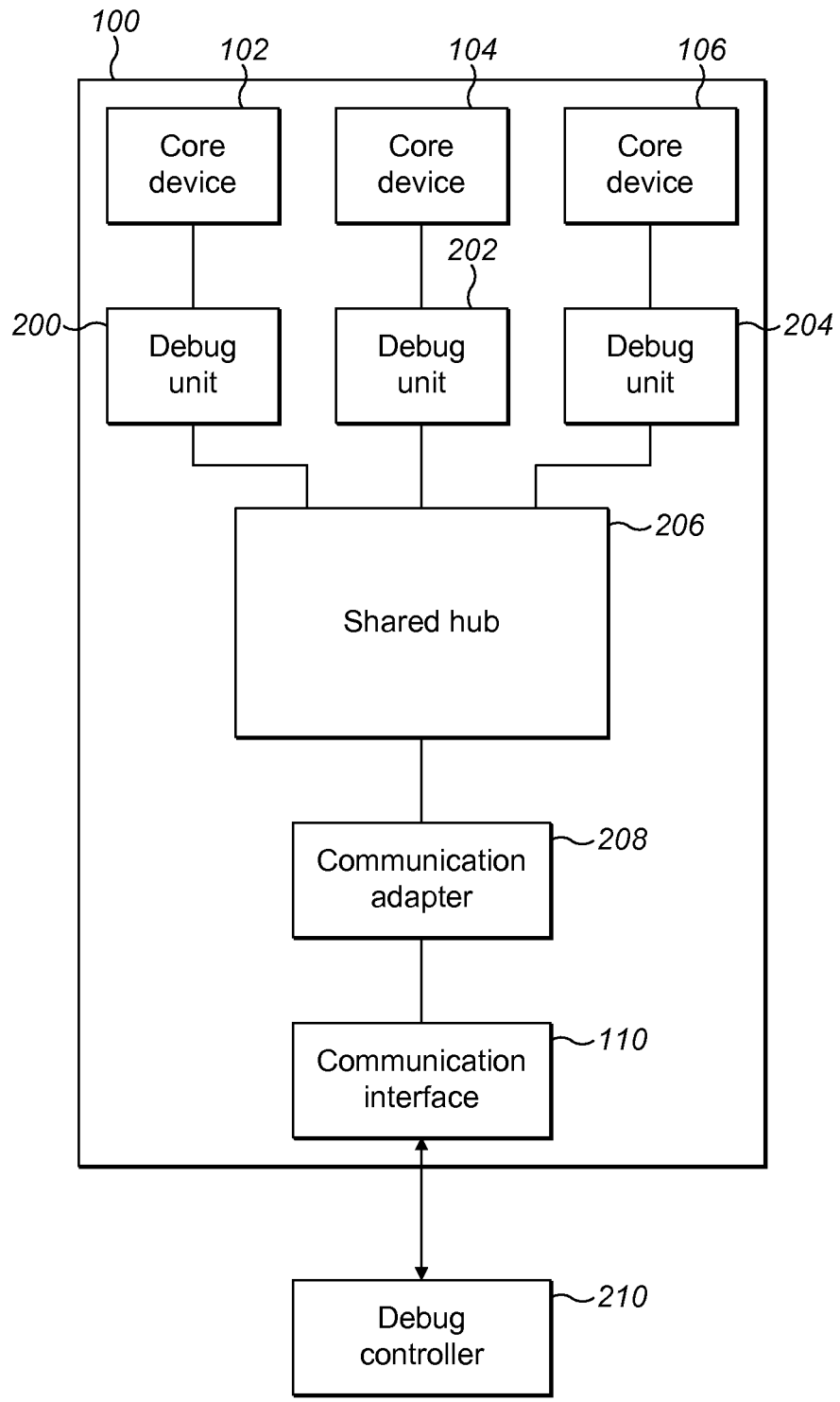
FIG. 2 is a schematic drawing of an exemplary debug architecture comprising a shared hub.
Figure 3:
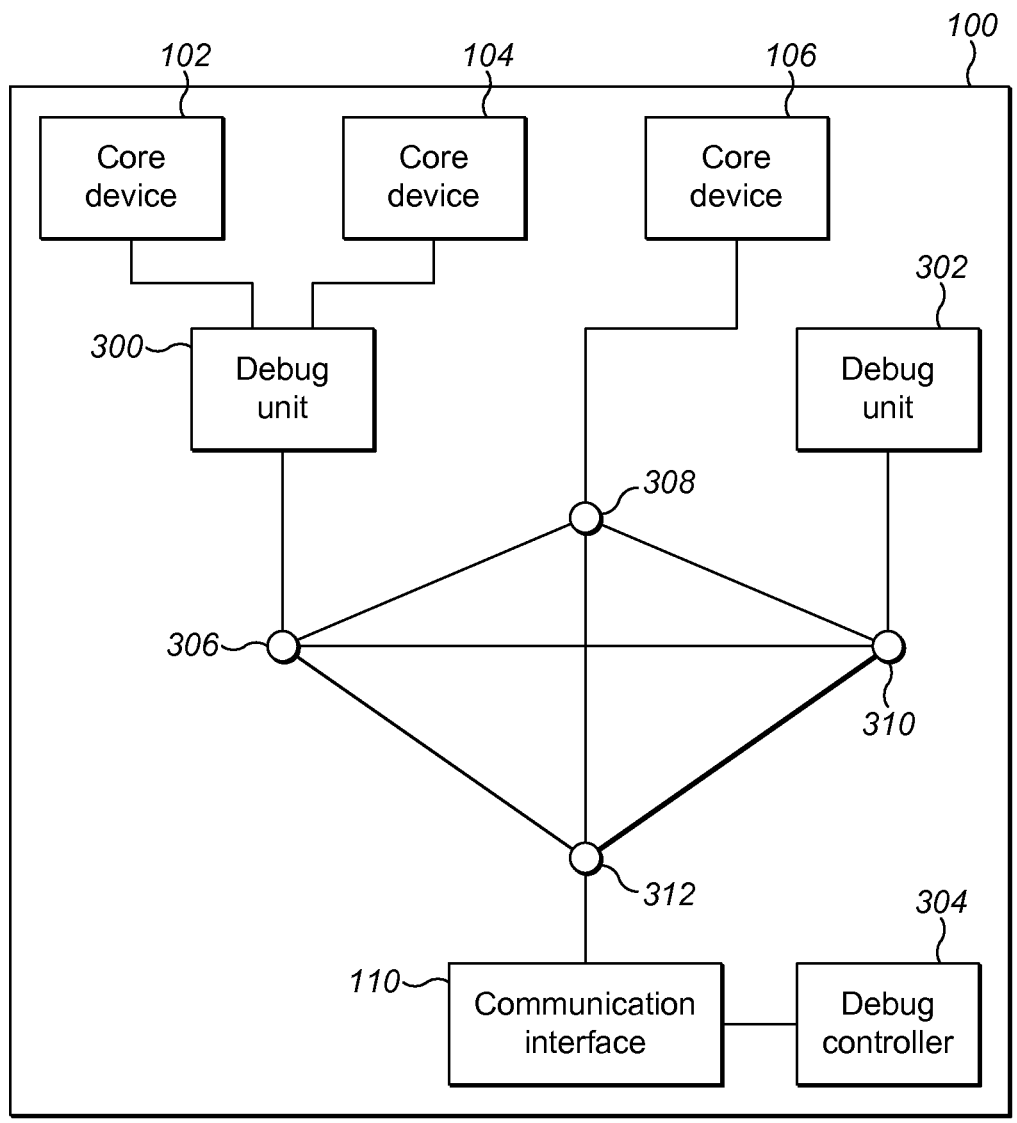
FIG. 3 is a schematic drawing of an exemplary debug architecture comprises a mesh network.
Figure 4:
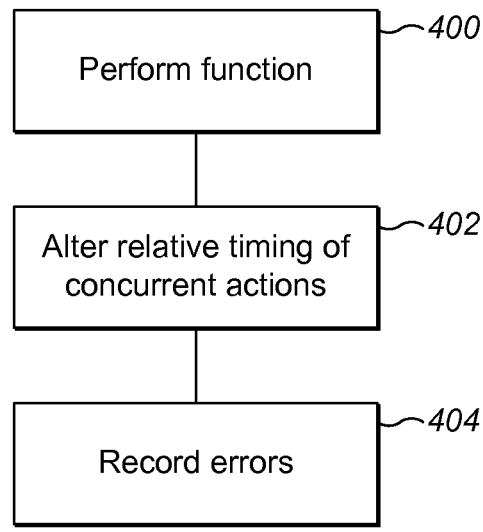
FIG. 4 is a flowchart illustrating a method for deliberately changing the timing of a concurrent system when functionally testing it.
Figure 5:
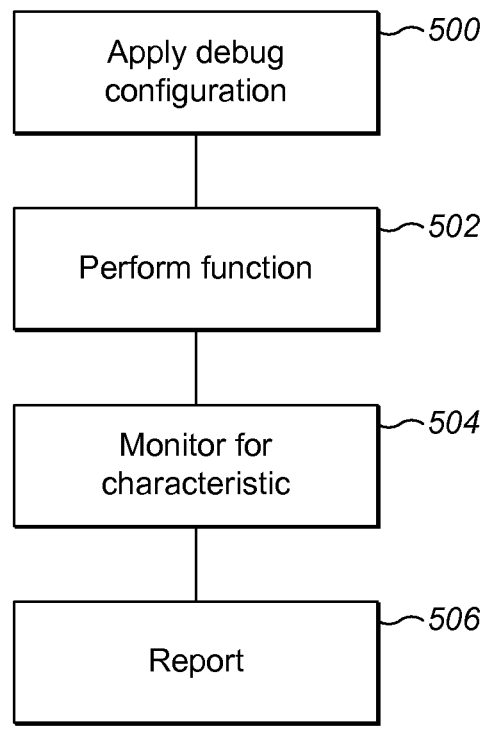
FIG. 5 is a flowchart illustrating a method of validating functional testing of system circuitry.
Figure 6:
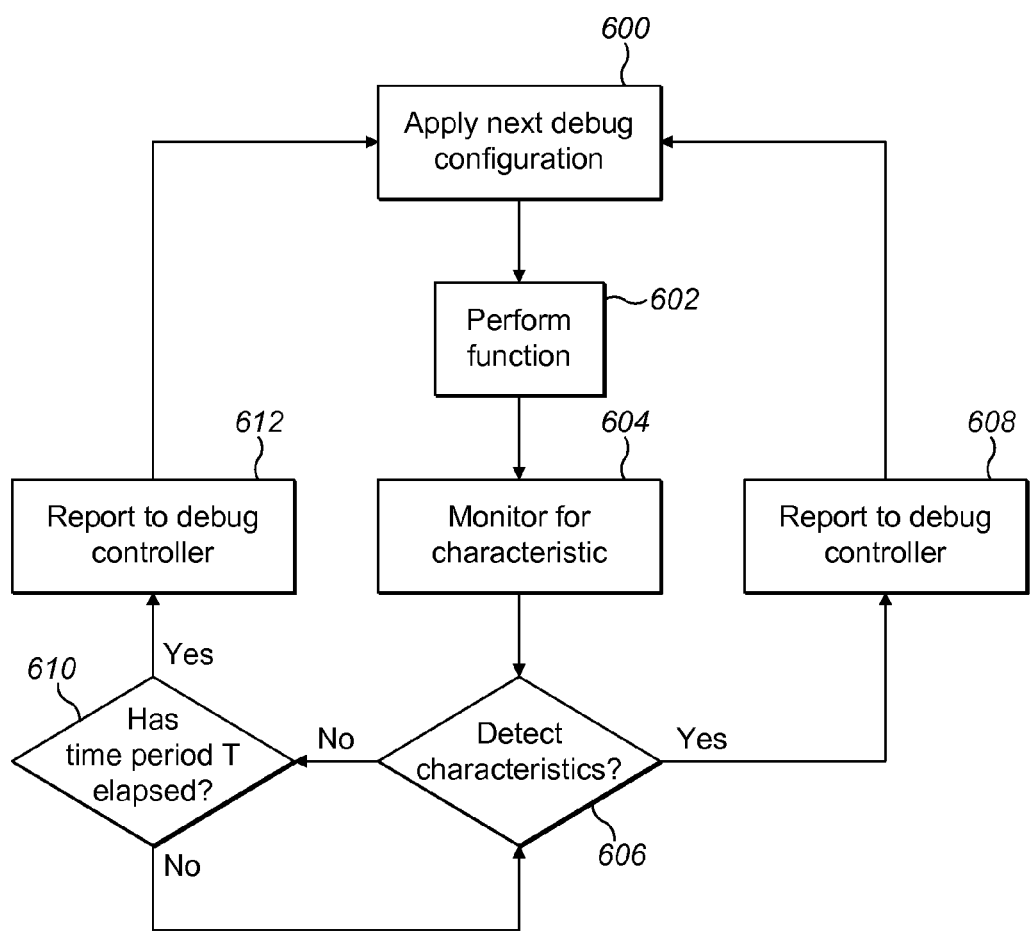
FIG. 6 is a flowchart illustrating a further method of validating functional testing of system circuitry.

FIGS. 1, 2 and 3 are schematic diagrams of exemplary debug architectures, and components within debug architectures. These figures present the structures in terms of functional blocks. Some functional blocks for carrying out functions well known in the art have in places been omitted from these figures. FIGS. 4, 5 and 6 are flowcharts illustrating methods of implementing functional tests and validation processes. Each flowchart depicts an order in which the method of that flowchart can be performed. However, the flowcharts are not intended to restrict the described methods to being implemented in the orders depicted. The steps of the methods may be carried out in alternative orders to those depicted in the flowcharts.

FIG. 1 illustrates the general structure of an exemplary debug architecture for a SoC 100. Core devices 102, 104 and 106 of the SoC are each connected to debugging circuitry 108. Although FIG. 1 illustrates three core devices, any number of core devices can be suitably integrated into the debug architecture. Exemplary core devices include a DSP (digital signal processor), video processor, applications processor or CPU (central processor unit), graphics processor, system memory, bus, system interconnect, RTOS (real-time operating system), software, data, custom circuit and a data engine. However, any component of a SoC is suitable for being incorporated into the debug architecture as a core device on FIG. 1. The core devices may be emulators or simulators of other devices on the chip. For example, a core device may emulate a processor.

The debugging circuitry is able to manipulate the operation of the core devices and monitor the operation of the core devices. The debugging circuitry is connected to a communication interface 110. Communication interface 110 may be configured to communicate with entities off-chip. For example, debugging circuitry 108 may communicate with an off-chip debug controller via communication interface 110. Communication interface 110 may also be configured to communicate with other entities on-chip. For example, debugging circuitry 108 may communicate with an on-chip debug controller via communication interface 110. Although FIG. 1 illustrates one communication interface, any number of communication interfaces can be integrated onto the SoC. The communication interfaces implemented are chosen in dependence on the type of connections that are to be made. Exemplary communication interfaces include: traditional debug interfaces such as JTAG, parallel trace input/output, and Aurora based high-speed serial interface; and reuse of system interfaces such as USB, Ethernet, RS232, PCIe and CAN.

The structure of the debugging circuitry is implementation-dependent. FIG. 2 illustrates an example in which the debugging circuitry comprises a shared hub 206, debug units 200, 202, 204 and a communication adapter 208. In FIG. 2, each core device 102, 104, 106 of the SoC is respectively connected to its own debug unit 200, 202, 204. The debug units are able to manipulate the operation of the core devices to which they are attached, and to monitor the operation of those core devices. The communication interface 110 is connected to a communication adapter 208. The communication adapter adapts signals that it receives to a format that is suitable for the communication interface that it is connected to. The communication interface 110 communicates signals to an off-chip debug controller 210. Each debug unit and the communication adapter is connected to a shared hub 206. Shared hub 206 routes signals between the devices on the chip. For example, the shared hub routes messages between the debug units. The shared hub also routes messages between the communication adapter and the debug units. The shared hub may also comprise resources which are shared between the debug units. For example, the shared hub may comprise a shared buffer for use by the debug units. By locating such resources in the shared hub as opposed to in the debug units, the debug units are made smaller and hence can be more easily integrated across the chip.

FIG. 3 illustrates another exemplary structure of the debugging circuitry which comprises a mesh network of nodes 306, 308, 310, 312 and debug units 300, 302. In FIG. 3, core devices 102 and 104 are both connected to the same debug unit 300. Core device 106 is not directly connected to a debug unit. Debug unit 302 is connected to node 310 of the mesh network, but not directly connected to a core device. The communication interface 110 communicates signals to an on-chip debug controller 304. The mesh network of nodes routes messages between the components of the SoC.

The debugging circuitry may comprise other types of interconnection for routing messages between components of the SoC. For example, the debugging circuitry may comprise a bus or a ring network. Alternatively, the debugging circuitry may comprise any combination of one or more shared hubs, buses, ring networks and mesh networks.

The debugging circuitry comprises one or more debug units. A debug unit may be connected to a core device (as shown in FIG. 2). A debug unit may be connected to more than one core device (as shown in FIG. 3). A debug unit may be not directly connected to a core device, but connected to the interconnection of the debugging circuitry (as shown in FIG. 3).

Suitably, the debugging circuitry is controlled by a debug controller. As described above, the debug controller may be located off-chip or on-chip. A debug controller located internally to the SoC has lower latency and higher performance compared to an off-chip debug controller. An alternative configuration may be implemented in which both an on-chip and an off-chip debug controller are used. In this situation, the off-chip debug controller is the dominant controller, in other words it acts as a master to the on-chip debug controller. The on-chip debug controller is more resource constrained than the off-chip debug controller. The division of control may be implemented such that the off-chip debug controller determines the debugging tasks to be implemented, and the on-chip debug controller buffers the tasks and schedules the timing of the next task in dependence on the other operations of the chip.

Software should ideally be written with precise knowledge of the performance of the underlying hardware, and precise knowledge of the required performance of the software. Thus, there would be confidence that the overall system meets the required performance. In practice, software is often written by trial and error to be empirically sufficient, with limited understanding of the possible failure modes of the system. This is due to limited visibility of the system below the programmer's model of the CPU, and also due to time pressures to get the product to market. Similarly, hardware units should be designed with precise knowledge of the other hardware units with which they are to interact. In practice, there are often ambiguities in their technical specifications and undefined behaviour, especially in regard to temporal performance and latencies that can be implementation specific. The resulting systems consequently contain bugs (errors).

As described above, functional testing of integrated circuits in a simulation environment is carried out in order to detect bugs. However, the simulation environment does not reflect the normal operating conditions of the chip in the final application product. This is because the simulator runs much more slowly (about $\frac{1}{10,000,000}$) and does not take into account other functions which the chip may be implementing concurrently with the tested function. Thus, functional testing in a simulation environment does not detect all the bugs which may occur when the chip is operating in its normal functional mode in the final application product.

The debugging circuitry described herein is configured to functionally test the system circuitry of the integrated circuit chip. In other words, the debugging circuitry tests the implementation of functions by system circuitry on the chip. The system circuitry carrying out the functions may be one or more of the core devices and/or interconnection circuitry on the chip, such as buses. A function is typically carried out as a series of actions. Typically, some of these actions are concurrent. The functional testing is performed when the chip is in its normal functional mode. Suitably, the functional testing is performed at the full operational speed of the chip in its functional mode. Thus, bugs which may happen when the chip is operating at full speed, but which are not detected in a simulation environment because it is running too slowly, are detectable by functionally testing the chip using the debugging circuitry.

Some bugs which may occur when the chip is operating in its functional mode are difficult to detect because the conditions that lead to them are rarely encountered. For example, there may be a potential race condition in a program or in the implementation of a communication interface, but this race condition is rarely encountered because the timing of the constituent actions of the function carried out by the program or communication interface is such that the function almost always works successfully. For example, if the function is carried out in isolation, then the constituent actions may be incidentally synchronised or desynchronised such that the race condition doesn't occur. As another example, if the function is carried out in isolation, then one action may run too slowly or too quickly for the race condition to occur. However, a small change in the timing of the constituent actions of the function could cause the race condition to occur. Such a change in timing may be caused by a seemingly inconsequential change to the system, for example a small delay in accessing a memory due to other circuitry accessing that memory.

The following description describes a method to increase the likelihood that errors of the type described above are detected during on-chip functional testing.

FIG. 4 illustrates a method for deliberately changing the timing of a concurrent system when functionally testing it in order to increase the likelihood of detecting latent bugs. At step 400, a function of the chip is tested by causing the system circuitry to perform a function. The function comprises concurrent actions, which are performed by sub-circuits of the system circuitry. At step 402, the relative timing of at least two of the concurrent actions is altered. At step 404, errors in the system circuitry's performance of the function are recorded by the debugging circuitry. Suitably, the debugging circuitry communicates the recorded errors to the debug controller.

Testing the same function a number of times, each time (i) changing the relative timing of a different set of two or more concurrent actions, and/or (ii) changing the magnitude of the alteration of the relative timing of the concurrent actions, increases the likelihood of one or more errors in the system circuitry's performance of the function. This is because the function is being tested under a wider set of conditions than during a simulation, or a run of the function in isolation on the chip, thus more timing-related bugs will be detected. By testing the function with changes in the relative timing of the concurrent actions, the test more accurately reflects conditions on the chip once it is operating in the final application product where competing uses of the system's resources will cause changes in the relative timing of the concurrent actions of a function compared to if the function is run in isolation.

The debugging circuitry comprises variability circuitry. The variability circuitry implements altering the relative timing of concurrent actions of a function. The variability circuitry may be part of the circuitry of a debug unit. The variability circuitry may form part of the circuitry of a plurality of debug units. The variability circuitry may be located on an interconnect to a core device or communication interface. For example, the variability circuitry may be located on a bus. Suitably, the variability circuitry is controlled by a debug controller. The debug controller may be on or off chip. The debug controller communicates with the variability circuitry via the routing provided by the debugging circuitry. In one implementation, the on-chip debugging circuitry reuses parts of the design for test (DfT) infrastructure including a JTAG interface and a test access port controller. Dedicated on-chip scan-chain circuitry is added to communicate with the debugging circuitry. This on-chip scan-chain circuitry does not interfere with the functional operation of the chip. The scan-chains for DfT purposes are not reused for the debugging circuitry because they would interfere with the functional operation of the chip and hence would cause corruption. In this case, the debug controller communicates with the variability circuitry via the routing provided by the on-chip scan-chain circuitry. The variability circuitry may be controlled by a plurality of debug controllers. For example, each debug controller may be configured to functionally test a different set of functions of the chip.

The variability circuitry may comprise one or more counters, one or more linear feedback shift registers, one or more pseudo random number generators, or any combination of these to alter the relative timing of the concurrent actions of a function.

The relative timing of the concurrent actions of a function may be altered by applying jitter to the timing of the concurrent actions. Jitter may be applied to the scheduled timing of every action of a function. Alternatively, jitter may be applied to only one or a selected proportion of the scheduled timings of the actions of a function.

The relative timing of the concurrent actions of a function may be altered by applying a delay to the timing of concurrent actions. The variability circuitry operates in one of several modes in order to apply the delay. These modes are:
1. A fixed delay applied to every occurrence of an action.
2. A fixed delay applied to a proportion of occurrences of an action.
3. A variable delay applied to every occurrence of an action.
4. A variable delay applied to a proportion of occurrences of an action.

These modes may be applied singularly or together. For example, the variability circuitry may operate in a mode in which a fixed delay is applied to every occurrence of a particular communication, and concurrently operate in a mode in which a variable delay is applied every time a particular signal is toggled. The variability circuitry generates the fixed or variable delay. The variability circuitry also generates the selection of the occurrences of an action which are to be delayed.

The variability circuitry may alter the relative timing of concurrent actions of a function directly. This may be implemented by delaying communications or by applying external stimulus. The variability circuitry may alter the relative timing of concurrent actions of a function indirectly.

The variability circuitry may alter the relative timing of concurrent actions by changing the frequency or phase of a clock signal output from a clock of the system circuitry. For example, the clock may clock a sub-circuit carrying out an action, such as a comparator which compares a value to a threshold on receipt of a clock edge. By changing the frequency of the clock input to the comparator, the times at which the comparison is done and the time at which the comparison result is output will change. The variability circuitry may alter the frequency of the clock itself. Alternatively, the variability circuitry may gate the output of the clock and apply pulse deletion. Pulses may be deleted periodically. Alternatively, pulses may be deleted randomly. Thus, the frequency or phase of the clock signal input to the sub-circuit is altered. Applying the change to the clock output, rather than the clock itself, is useful when the clock is also providing a clock signal to other circuitry which it is not desired to alter the timing of in the functional test. Additionally, applying the change to the clock output is useful if the clock has a static design or limited configurability, for example if it is part of a phase locked loop with a fixed divide ratio or limited bandwidth.

The variability circuitry may alter the relative timing of concurrent actions by introducing clock cycle delays in signalling processes. The signalling processes may occur on interconnect circuitry which routes signals between core devices and/or communication interfaces and/or the debugging circuitry. For example, the variability circuitry may apply additional clock cycles to a bus handshake by intercepting the constituent signals of the handshake and artificially delaying them by one or more clock cycles. For example, the variability circuitry may artificially delay READY or ACK (acknowledge) signals of the handshake procedure.

The variability circuitry may alter the relative timing of concurrent actions by intercepting or delaying an individual signalling transaction on interconnect circuitry based on the total number of transactions in progress on that interconnect. For example, the completion of a transaction on a bus may be deliberately blocked so that the number of concurrent accesses of the bus increases to a threshold. This may be used to increase the loading of a bus from light to maximum capacity.

The variability circuitry may alter the relative timing of concurrent actions by slowing the performance of a credit controlled bus or on-chip network, for example by delaying the return of credit or flow of data. The variability circuitry may comprise dynamically configurable delay registers in the credit signals or data bus in order to apply these delays.

The variability circuitry may alter the relative timing of concurrent actions by applying an error to one or more of the concurrent actions. Suitably, the error is applied where it is detectable by the system circuitry. Suitably, the error is applied where it is likely to be detected by the system circuitry and an accommodating procedure implemented. For example an ACK (acknowledge) signal may be corrupted such that it is not received. In response to not receiving the ACK signal in a set time period, the recipient may respond by implementing an accommodating procedure, such as initiating a retry of the signalling process which the ACK signal was intended to acknowledge. An alternative accommodating procedure is a recovery operation.

The variability circuitry may alter the relative timing of concurrent actions which use a cache by intentionally invalidating one or more cache-lines of the cache. The variability circuitry may introduce extraneous cache-coherency traffic to a cache-coherent bus or network. Thus, the cache access required by the action would be delayed as a result of the increased cache accesses by the additional cache traffic.

The variability circuitry may alter the relative timing of concurrent actions by changing the thread scheduling used by the operating system. The result of altering the thread scheduling might be, for example, that a message in memory may be bypassed, or the configuration of a register altered.

Suitably, the SoC is configured to implement locks on pathways emanating from the debugging circuitry. For example, the SoC may be configured to implement locks on the pathways between the debugging circuitry and the core device. Similarly, the SoC may be configured to implement locks on the pathways between the debugging circuitry and the communication interfaces. Suitably, the locks are implemented in circuitry which is configured to enable the locks to be asserted or deasserted. An asserted lock restricts the passage of some messages along the pathway. For example, an asserted lock on a pathway may prevent all messages from a debug controller passing along that pathway. An asserted lock may prevent the passage of messages from one source but not prevent the passage of messages from another source. An asserted lock may prevent the passage of a certain type of message but allow the passage of a different type of message. For example, an asserted lock may prevent the passage of control signals to a core device but allow the passage of trace data. In this example, the control signals are to control the action of the core device, and the trace data is a recorded output of the core device. The variability circuitry may alter the relative timing of concurrent actions by changing the speed at which locks are implemented on the pathways. The variability circuitry may alter the relative timing of concurrent actions by artificially locking pathways for additional clock cycles to those scheduled.

The variability circuitry may alter the relative timing of concurrent actions by preventing a core device from performing certain actions for a time duration. For example, if the core device comprises a processor, the variability circuitry may stop the processor from accessing one or more memory locations for a time duration. On the time duration ending, the processor is able to use the memory again. As another example, if the core device comprises a processor, the variability circuitry may stop the processor using a halt signal (or similar signal connected to a debug unit) for a time duration. On the time duration ending, the processor is able to run again. The halt signal may be part of the interface between the debugging circuitry 108 and the core device. In one implementation, two debug units are associated with a core device: a debug unit which is part of debugging circuitry 108 and a debug unit provided by the vendor of the core device. In this situation, the variability circuitry in the debug unit which is part of debugging circuitry 108 may intercept a halt signal from the vendor's debug unit and use it to stop a processor in the core device. The variability circuitry does not inform the vendor's debug unit of the interception, thus the vendor's debug unit has no knowledge of the interception. As a further example, if the core device comprises a processor, the variability circuitry may stop the processor using a signal external to the processor for a time duration. For example, the variability circuitry may stop the processor using a signal originating off-chip for the time duration. On the time duration ending, the processor is able to run. Suitably, a debug controller controls the stopping and starting of a processor by sending control signals via the debugging circuitry to the core device.

The variability circuitry may alter the relative timing of concurrent actions by including additional instructions in a program, which cause the processor executing that program to take longer to do so. The timing alteration may be applied by causing the processor to increase the time it takes to process the instructions, for example by causing it to wait on a timer. The timing alteration may be applied by including additional routines in a program, for example by writing data to a memory or register and then reading it from that memory or register. Suitably, a debug controller controls the modifications to the processing of the program by the processor, such as by dynamically or statically introducing a jump patch.

The variability circuitry may be configured to alter its behaviour in response to debug events occurring on the SoC. If the variability circuitry is located in a debug unit, it may alter its behaviour in response to a debug event originating at that debug unit. Alternatively, the variability circuitry may alter its behaviour in response to a debug event originating from one or several debug units located elsewhere on the SoC.

A debug unit is configured to monitor for the occurrence of certain characteristics of the system, and to identify when it has identified one of those characteristics by generating a debug event. The debug event is distributed to the debugging circuitry. Examples of characteristics which a debug unit might be configured to identify are: an access to a memory address; a system event; a buffer reaching a prescribed level; system circuitry being enabled, disabled or configured; expiry of a timer; toggling of a signal or device input; receiving a packet on a communication interface; and a software context switch. A single debug unit may be configured to monitor for more than one characteristic and to generate a debug event on observing any one of the monitored characteristics. Alternatively, a debug event may only be generated in response to a group of debug units all observing the same characteristic. Alternatively, a set of characteristics may be defined, and a debug event only generated in response to the group of debug units as a whole observing that set of characteristics.

The variability circuitry may alter its behaviour in response to a debug event by enabling variability. In other words, if the variability circuitry previously applied a fixed delay, it may alter its behaviour to apply a variable delay to the timing of concurrent actions. The variability circuitry may alter its behaviour in response to a debug event by disabling variability. In other words, if the variability circuitry previously applied a variable delay, it may alter its behaviour to apply a fixed delay to the timing of concurrent actions.

The variability circuitry may alter its behaviour by varying the amount of variability. For example, if the variability unit selects the length of delay to apply to be a function of the output of a pseudo-random number generator, a configuration may be applied to the pseudo-random number generator to constrain its output. For example, the amount of variability may be increased by increasing the range from which the initial seed value of the pseudo-random number generator is selected or increasing the number of bits used from the pseudo-random number generator, such that the random number generated is within a greater range. Similarly, the amount of variability may be decreased by decreasing the range from which the initial seed value of the pseudo-random number generator is selected or reducing the number of bits used from the pseudo-random number generator, such that the random number is generated within a more limited range.

The amount of variability of the variability circuitry may be configurable using memory mapped registers. The memory mapped registers may be accessible and controlled by a debug controller. The memory mapped registers may be accessible and controlled by software implemented on a processor of a core device. That processor may be part of the system circuitry that is carrying out the functional testing. In other words, the debugging circuitry may be altering the relative timing of concurrent actions, at least one of which is being implemented on that processor. Alternatively, the debugging circuitry may not be altering the relative timing of concurrent actions on that processor.

Suitably, the debugging circuitry implements a functional test by systematically varying the timing of a function over a number of repeated runs. This increases the likelihood of detecting intermittent errors. Additionally, a systematic approach decreases the likelihood that a detectable error will be missed.

Functional testing can be used to characterise the performance requirements of the system circuitry's implementation of a function. Thus, it can be used to check that the system circuitry implements the function as required within the limits specified. It can also be used to determine the minimum system resources required by the system circuitry in order to perform the function.

For example, system circuitry may be intended to implement a function correctly as long as it has 50% of the system resources. The debugging circuitry may be configured to implement a functional test so that the system circuitry repeatedly performs the function. On each repeat performance of the function, the variability circuitry alters the relative timing of the concurrent actions with an increased likelihood of that alteration causing an error compared to the last iteration of the function. The system circuitry repeatedly performs the function until it fails to perform the function correctly. At that time, the amount of variability applied to the relative timing of the concurrent actions can be assessed to determine if it is consistent with the system resource limit specified, in this case 50%. Additionally, the way in which the system circuitry failed to perform the function can be evaluated to determine if it is consistent with how it is supposed to fail on reaching the system resource limit.

On identifying an error in the system circuitry's performance of a function, the conditions used to generate the timing alterations for that run may be identified. For example, if the variability circuitry applied a delay which was a function of the output of a pseudo-random number generator, the initial seed value input to the pseudo-random number generator for that run may be identified. The run may then be repeated (by inputting that same initial seed value into the pseudo-random number generator) and inspected more closely. For example, if the error was in a processor core's processing of an instruction, then the core device may be traced on the re-run, and that trace data sent to the debug controller. The debug controller may then determine the cause of the error.

By performing the same function repeatedly with an increased likelihood of an error occurring on each run, the requirements of the system circuitry in order to perform that function can be determined. Suitably, several sets of repeated runs are implemented. Each set of repeated runs applies a different alteration to flush out an error. For example, the first set of repeated runs may change the bandwidth and latency of a memory access. On each run of the first set, the variability circuitry decreases the bandwidth and increases the latency. The first set of repeated runs is terminated when an error is detected. The second set of repeated runs may invalidate cache-lines as if another program were running. On each run of the second set, the variability circuitry increases the number of cache-lines that are invalidated. The second set of repeated runs is terminated when an error is detected. A profile of the minimum system resource required for the function to be performed correctly may then be determined from the level of aggravation that caused the error on each set of runs.

Functional testing can be used to determine the impact on system circuitry of a change in the timing of a sub-circuit of that system circuitry. For example, functional testing can be used to determine the effect on the system circuitry of changing the performance of a memory. Typically, the impact of a sub-circuit on the performance of the system circuitry depends on the load on the system circuitry and the functions that it is implementing. However, by implementing a first set of repeated runs in which the sub-circuit runs at full-speed, and a second set of repeated runs in which the sub-circuit runs at a slower speed, the difference between the two can be analysed. For example, the slower speed may be 1% slower than the full-speed. The comparison between the level of aggravation taken to cause the error on the full-speed set of runs and the slower speed set of runs gives an indication of the sensitivity of the system circuitry to the timing of that sub-circuit. An appreciable difference in performance between the two sets of runs suggests that there would be significant performance benefits of implementing that sub-circuit at a greater speed than the current full-speed. Little difference in the performance between the two sets of runs suggests that there would be minimal performance benefits from implementing the sub-circuit at a greater speed than the current full-speed. For lower power devices, this is useful for determining how to apportion limited power for the best performance.

Suitably, a validation plan is generated which itemises the functions of the SoC that are to be tested. The validation plan may also list the manner in which each function is to be tested, for example the concurrent actions of the function whose relative timing is to be altered in each run, and/or how the relative timing is to be altered, and/or the degree of variability applied to alter the relative timing. The debugging circuitry monitors the system circuitry's performance of the function being tested. The debugging circuitry reports to the debug controller. If the functions are performed correctly within the prescribed limits, the debug controller determines that the function has been suitably exercised. In other words, the debug controller deems the system circuitry's implementation of that function to be validated, and hence ready to go to market.

FIG. 5 illustrates a method of validating functional testing of system circuitry on an integrated circuit chip. At step 500, a debug configuration is applied to one or more debug units. At step 502, a function of the chip is tested by causing the system circuitry to perform the function. The debug configuration causes the debug unit(s) to monitor the system circuitry for a particular characteristic in the system circuitry's performance of the function, at step 504. At step 506, the debug unit(s) reports to the debug controller. Suitably, the chip is functionally tested according to the methods described herein, including with respect to FIG. 4.

There are various characteristics in the system circuitry's performance of the function which may be monitored by the debug units. These characteristics include current configurations of system circuitry, current operating parameters of system circuitry, data types being held or processed by system circuitry, data values being held or processed by system circuitry, and the temporal nature of any of these. The characteristics may be internal to a core device. Alternatively, the characteristics may be an interaction between two or more core devices. A characteristic may be an individual occurrence to be detected, for example a specific signal value. Alternatively, a characteristic may be a series of occurrences to be detected. For example, the characteristic may be a combined scenario which results from cross-functionality between several core devices. Each core device involved in the cross-functionality is monitored. On detection of each of the occurrences in the series, the characteristic is considered to have been detected. The series of occurrences may be the logical combination of several concurrent occurrences. Alternatively, the series of occurrences may be a combination of occurrences which happen over time to form a temporal sequence. Where a characteristic is a series of occurrences, the debugging circuitry may employ several debug units to detect the constituent occurrences of the series and to communicate detection of these occurrences to each other using trigger events. Once all of the constituent occurrences of the series have been detected, the characteristic is considered detected. Thus, the debug controller is able to validate the sequence of behaviour which was being tested.

An exemplary characteristic is the state or state transitions of a finite state machine. Another exemplary characteristic is the state or state transitions of a register. Another exemplary characteristic is the value or transition of a system signal, such as a bus signal. Another exemplary characteristic is a system event, for example an error, interrupt, power-down sequence, change in voltage or frequency, change in cable connectivity. Another exemplary characteristic is a queue or buffer level, for example of a first in first out (FIFO) buffer. Another exemplary characteristic is a memory address range or a data value held in a memory location. Another exemplary characteristic is the act of writing data to a register, for example a register provided by a debug unit. Exemplary characteristics include states, values, events, transitions or sequences, and any temporal nature of these.

The debugging circuitry may indirectly functionally test the SoC. For example, if it is desired to functionally test system software, the debugging circuitry tests the effect the system software has on the system hardware. For example, the debugging circuitry may monitor for characteristics such as memory accesses, bus accesses, register accesses to the core devices, or register accesses to part of the debugging circuitry in order to validate the SoC's implementation of software functions.

A debug configuration is a configuration that is applied to a debug unit in order to cause that debug unit to monitor for the desired characteristic of the system circuitry's performance of a function. A debug configuration configures constituent circuitry of the debug unit to monitor for a particular characteristic. That constituent circuitry may include a qualifier to filter signals input to a debug unit such as system signals, values or states to the part of the debug unit that monitors for the characteristic. The constituent circuitry may include an accumulator. Exemplary functions of such an accumulator include counting signal transitions, counting the number of times a value or state has been observed, and summing observed values. The constituent circuitry may include a trace unit, for example to capture data input or output from an attached core device. The constituent circuitry may include a sequencer to identify a sequence of input transitions. The constituent circuitry may include a timer to monitor the temporal relationship of inputs. Suitably, the constituent circuitry includes cross-triggering circuitry which enables observations of one debug unit to be cross-triggered and combined with those made by a different debug unit. Typically, the debug unit monitors for the characteristic by using signals to observe the system circuitry. For example, if the characteristic is the state of a register, then the debug unit may implement a latch signal that provides the state of the register.

Suitably, the validation of the functional testing is controlled by a debug controller. The debug controller schedules validation tasks to be carried out. A validation task, if successful, validates that a function has been successfully functionally tested. Suitably, the debug controller schedules these validation tasks iteratively. As already described, the debug controller may be located on-chip, off-chip, or both on-chip and off-chip. In this latter case, the off-chip debug controller may select the validation tasks and the order in which those tasks are to be carried out. The on-chip debug controller may buffer the flow of validation task requests from the off-chip debug controller, and may also schedule when the next validation task is to be carried out by the debugging circuitry.

In one implementation, the debug unit detects the characteristic that it is monitoring for, and reports detection of that characteristic to the debug controller. Consider the example in which the characteristic that the debug unit is monitoring for is a particular signal value. On observing that signal value, the debug unit determines that it has detected the characteristic. The debug unit then reports detection of this characteristic to the debug controller. For example, the debug unit may transmit a positive match message to the debug controller. This message is interpreted by the debug controller to mean that the observed signal value matched the characteristic, in other words that the characteristic was detected. Alternatively, the debug unit may transmit an event message to the debug controller. Depending on the value of the event, the debug controller may interpret the event message to mean that the characteristic was detected or that the characteristic was not detected.

In another implementation, the debug controller detects the characteristic that the debug unit was monitoring for. In this implementation, the debug controller post-processes the data reported to it by the debug unit in order to assess whether the functional test has been successful or not. The debug unit may output data messages to the debug controller periodically. These messages may inform the debug controller of the status of the constituent circuitry of the debug unit that is configured to monitor for the characteristic. For example, the messages may include status information of the debug unit's accumulators, counters or sequencer. The messages may include trace data, for example values observed at the debug unit in response to a system signal's value or transition. The debug controller may receive several data messages from one or more debug units, and aggregate information from these data messages in order to detect the characteristic. The debug controller may assess whether the functional test has been successful or not based on the length of time taken for the debug unit to collect the relevant information that it was monitoring for. Time can be measured in terms of: the clock cycles the relevant core device has operated for; or the number of times it has performed a function or exhibited a characteristic; or the elapsed real time.

The debugging circuitry described herein is located on the integrated circuit chip that is being functionally tested. The proportion of the area of the chip that can be practically employed for the debugging circuitry is therefore limited. Thus, only a limited set of signals can be monitored in total by functional testing on the chip, and only a subset of that set of signals can be monitored at the same time. The subset of signals to be monitored at any one time is selected from the total set using multiplexing. The multiplexor may be internal to the debug unit. The multiplexor may be external to the debug unit. The multiplexor routes the subset of signals through to the constituent circuitry of the debug unit configured to monitor for the characteristic.

Suitably, a list of functional tests that are likely to provide useful information is generated. The functional tests to be carried out are selected from this list. The selection may be determined based on any one or combination of the following: which functional tests the debugging circuitry is capable of carrying out; the amount of debugging circuitry that can be integrated onto the chip given the competing constraint of chip area; and which components of debugging circuitry can be integrated onto the chip given the competing constraint of chip area. The selection may also be determined based on the relative importance of the functions to be tested. The selection may also be determined based on how revealing the monitored characteristic is about the system circuitry's performance of one or more functions. Easily monitored, revealing characteristics are more likely to be selected for being monitored. The selection may also be determined based on the functional testing that is carried out prior to manufacturing the chip, for example in a simulation or emulation environment. The system circuitry not thoroughly exercised before the chip is manufactured is more likely to contain errors. Thus, those functional tests which test functions which were not functionally tested prior to manufacture of the chip are more likely to be selected than those which were functionally tested prior to manufacture of the chip. Integration testing, system-level verification and formal verification are examples of verification tasks performed prior to manufacture of the chip. Those functional tests which test functions only partially functionally tested prior to manufacture of the chip are more likely to be selected than those which were fully functionally tested prior to manufacture of the chip.

Debugging circuitry for the selected functional tests is integrated onto the SoC. Thus, the resulting integrated SoC is capable of performing the selected functional tests and hence validating these functional tests. The characteristics to be monitored for each functional test are determined, and the debug configurations corresponding to those characteristics determined. The debug configurations may be determined manually by an engineer. Alternatively, the debug configurations may be determined using an automated process.

FIG. 6 illustrates a method of validating functional testing of system circuitry on an integrated circuit chip. At step 600, a debug configuration is applied to a debug unit. At step 602, the system circuitry performs a function. At step 604, the debug unit monitors for the characteristic corresponding to the debug configuration. At step 606 it is determined whether the characteristic has been detected. This step may happen at either the debug unit or the debug controller. If the characteristic is detected by the debug unit, then at step 608 the debug unit reports that the characteristic has been detected to the debug controller. The debug controller then applies the debug configuration for the next test to the debug unit at step 600.

The debug unit may continue to monitor for a characteristic until it is detected. Alternatively, as illustrated at step 610, the debug unit may only monitor for a characteristic for a time period T. If the characteristic is not detected in that time period T, then the debug controller applies the debug configuration for the next test to the debug unit at step 600. The characteristic is recorded as undetected. If the debug unit is configured to detect the characteristic, but after the elapsed time T the debug unit has not yet detected the characteristic, then at step 612, the debug unit reports the characteristic as undetected to the debug controller.

FIG. 6 illustrates applying one debug configuration at a time to a debug unit. In an alternative implementation, several debug configurations may be applied to a debug unit concurrently. The debug unit then monitors for a plurality of characteristics, one corresponding to each debug configuration. Different circuitry of the debug unit is used to monitor for each characteristic. In other words, the resource usage of the debug unit for monitoring each characteristic is mutually exclusive. Thus, the different debug configurations configure different constituent circuitry of the debug unit.

In one implementation, a set of at least one debug configurations may be applied to one debug unit and a different set applied to a different debug unit. The two debug units are thus configured to monitor for different characteristics. The system circuitry then performs a function. Whilst the system circuitry is performing the function, the first debug unit monitors for a first set of one or more characteristics, and the second debug unit monitors for a second set of one or more characteristics.

The debug controller controls the debugging circuitry to perform the steps of FIG. 6 iteratively, until all the debug configurations for that functional test have been applied and the corresponding characteristics monitored for. If all the characteristics of a functional test have been detected, then that function is validated. In other words, the validation task for that function is successful. The outcome of the validation task may be determined at the debugging circuitry and reported to the debug controller. Alternatively, the debug units may report detection or undetection of the characteristics to the debug controller, and the debug controller determine the outcome of the validation task.

When a characteristic is undetected, the debug controller may reschedule a further functional test. For example, the debug controller may control the debugging circuitry to perform a further functional test in which the length of the time period T at step 610 is longer than in the test in which the characteristic remained undetected. As another example, the debug controller may control the debugging circuitry to perform a further functional test in which a different characteristic is monitored for compared to the characteristic that remained undetected. This different characteristic provides the same or similar information about the system circuitry's performance of the function as the undetected characteristic. As another example, the debug controller may control the debugging circuitry to perform a further functional test in which the function carried out is modified so as to increase the likelihood that the characteristic is detected. For example, parameters of the function may be modified. Data from the debug units may be used by the debug controller to determine modifications to make to the functional test in order to increase the likelihood of validating the function. For example, trace data from the system circuitry implementing the function may be analysed by the debug controller to determine why the characteristic remained undetected during the functional test.

In one example functional test, a finite state machine (FSM) is tested. The characteristics monitored by the debug unit are the states of the FSM and the transitions between the states. The debug unit comprises an input bus connected to the state register of the FSM. In a first method, the debug unit traces the changes in the state of the FSM. The debug unit sends the trace data to the debug controller. The debug controller records the states and state transitions of the FSM, for example in a scoreboard. Only one debug configuration is applied to the debug unit in order to monitor the states and state transitions of the FSM. However, significant communication bandwidth from the debug unit to the debug controller is needed to convey the collected trace data. In a second method, the debug unit uses a filter to monitor for specific states of the FSM, and uses a sequencer and several filters to monitor for state transitions of the FSM. When the state input to the filter matches a value in the filter, the matching can be notified directly to the debug controller using a communication message or an event message. Alternatively, the matching can be notified indirectly to the debug controller using a counter that subsequently has its count output as a message to the debug controller. This second method requires less communication bandwidth from the debug unit to the debug controller than the first method. It is also useful if the debug unit is not configured to trace the state of the FSM.

In another example functional test, a queue (or FIFO buffer) is tested. The characteristic monitored is the level of the queue. The debug unit comprises a filter. The filter may be configured to monitor for any of the following characteristics: whether the level of the queue has attained a specified value, for example its minimum value or its maximum value; whether the level of the queue lies within a specified range; whether the level of the queue has transitioned from its minimum value to its maximum value; whether the level of the queue has transitioned from its maximum value to its minimum value; whether the level of the queue has transitioned between two specified values or ranges between the minimum value and the maximum value. In this example, the level of the queue is monitored, however another suitable parameter may be monitored.

In another example functional test, a bus is tested. The characteristic monitored is the maximum number of concurrent transactions that are applied to the bus. The debug unit comprises a counter capable of incrementing when a transaction starts and decrementing when a transaction finishes, and maintains a record of the maximum count value. The debug unit may communicate the current maximum count value to the debug controller. Alternatively, the debug unit may compare the current maximum count value to a prescribed maximum count value, and once the current maximum count value is the same as or higher than the prescribed maximum count value, communicate that to the debug controller. The debug unit may be implemented as a bus monitor in this example.

In another example functional test, a bus is tested. The characteristic monitored is how many bus transactions of a predetermined type have been made within one or more predetermined address ranges (bins). The debug unit comprises an address range filter to identify bus transactions of the predetermined type within the one or more predetermined address ranges. The debug unit also comprises a counter, and on identifying a bus transaction of the predetermined type, the debug unit increments the counter. The debug unit communicates the counter value to the debug controller. The debug controller populates a histogram or scoreboard with the counter values. On detecting a desired number of transactions in each address range, the debug controller determines this function of the bus to have been fully tested and hence validated.

The apparatus and methods disclosed herein describe performing functional testing and validation on the manufactured integrated circuit chip whilst the chip is operating at full-speed. By performing the functional tests at full-speed, the behaviour of the chip's operation in the final application product is more closely mimicked, and hence bugs which would degrade the performance of the chip in the final application product are more likely to be identified. Running the application software of a SoC at full-speed enables the chip to be stressed sufficiently to exercise its functionality fully. Thus additional bugs (to those found in simulation or emulation testing) are identified before the SoC is used within systems sold commercially or before an otherwise revised SoC design is manufactured. By validating the functions of a SoC whilst running the chip at full-speed, a more rigorous and robust validation is achieved.

This description refers to functional testing and validation of a SoC, however it will be understood that functional testing and validation of an FPGA can be carried out in the same manner.

Each component of the SoC illustrated in FIGS. 1, 2 and 3 may be implemented in dedicated hardware. Alternatively, each component of the SoC illustrated in FIGS. 1, 2 and 3 may be implemented in software. Some components may be implemented in software, whilst other components are implemented in dedicated hardware.

Suitably, debugging circuitry 108 including any debug units, and communication interface 110 are hardware circuits forming part of SoC 100. Preferably, debug units for controlling and/or monitoring complex core devices and peripherals such as processors use suitably complex state machines as part of their control unit. Suitably, communication interfaces use suitably complex state machines to implement their complex protocols. Various approaches to realising state machines are known. Such state machines can be realised using: (i) only logic gates; (ii) a combination of logic gates and memory, where the memory is used to contain tables of values to simplify the state machine's operation or to make it programmable; or (iii) a processor core to execute software stored in memory. Where a processor core is used it can be: (i) integral to the specific debug unit, communication interface, or other debugging circuitry; or (ii) shared between several debug units to reduce their implementation resources and cost.

The SoC described is suitably incorporated within a computing-based device. The computing-based device may be an electronic device. Suitably, the computing-based device comprises one or more processors for processing computer executable instructions to control operation of the device in order to implement the methods described herein. The computer executable instructions can be provided using any computer-readable media such as a memory. Further software can be provided at the computing-based device to implement the methods described herein. The methods described herein may be performed by software in machine readable form on a tangible storage medium.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein, and without limitation to the scope of the claims. The applicant indicates that aspects of the present invention may consist of any such individual feature or combination of features. In view of the foregoing description it will be evident to a person skilled in the art that various modifications may be made within the scope of the invention.

The invention claimed is:

1. An integrated circuit chip comprising:
    system circuitry configured to perform a function, the system circuitry comprising a plurality of sub-circuits configured to perform the function by performing concurrent actions;
    debugging circuitry configured to detect one or more errors in the system circuitry's performance of the function, the debugging circuitry comprising variability circuitry;
    wherein the debugging circuitry is configured to functionally test the system circuitry by:
    at the variability circuitry, altering relative timing of the concurrent actions so as to increase the likelihood of one or more errors in the system circuitry's performance of the function, wherein the relative timing of the concurrent actions is altered by applying a delay to occurrences of a particular action of the concurrent actions by intercepting or delaying a communication through system circuitry; and
    recording one or more errors.

2. An integrated circuit chip as claimed in claim 1, wherein the variability circuitry is further configured to alter the relative timing of the concurrent actions by applying jitter to the timing of the concurrent actions.

3. An integrated circuit chip as claimed in claim 1, wherein the system circuitry comprises a clock, and the variability circuitry is further configured to alter the relative timing of the concurrent actions by modifying the frequency or phase of the clock output.

4. An integrated circuit chip as claimed in claim 3, wherein the system circuitry comprises clock gating circuitry at an output of the clock, and the variability circuitry is further configured to modify the frequency of the clock output by controlling the clock gating circuitry to delete clock pulses output from the clock.

5. An integrated circuit chip as claimed in claim 1, wherein the system circuitry comprises interconnect circuitry, and wherein the sub-circuits are configured to perform the concurrent actions by communicating signals on the interconnect circuitry, and wherein the variability circuitry is further configured to alter the relative timing of the concurrent actions by intercepting or delaying the signals on the interconnect circuitry.

6. An integrated circuit chip as claimed in claim 1, wherein the variability circuitry is further configured to alter the relative timing of the concurrent actions by applying an error to one or more of the concurrent actions.

7. An integrated circuit chip as claimed in claim 1, wherein the system circuitry comprises a cache, and wherein the sub-circuits are configured to perform the concurrent actions using the cache, and wherein the variability circuitry is further configured to alter the relative timing of the concurrent actions by invalidating cache lines of the cache.

8. An integrated circuit chip as claimed in claim 1, wherein the system circuitry comprises a processor, and wherein the variability circuitry is further configured to alter the relative timing of the concurrent actions by stopping the processor for a time duration.

9. An integrated circuit as claimed in claim 1, wherein the debugging circuitry is configured to functionally test the system by:
    causing the system circuitry to repeatedly perform the function; and
    at the variability circuitry, on each repeat performance of the function, altering the relative timing of the concurrent actions such that the likelihood of one or more errors in the system circuitry's performance of the function is higher than that likelihood for the last repeat performance of the function; and
    recording one or more errors.

10. An integrated circuit as claimed in claim 9, wherein the debugging circuitry is configured to determine minimum system resources required by the system circuitry in order to perform the function in dependence on the functional test.

11. An integrated circuit as claimed in claim 1, wherein the variability circuitry is further configured to alter the relative timing of the concurrent actions in response to debug events occurring on the integrated circuit chip.

12. An integrated circuit chip as claimed in claim 1, wherein the variability circuitry comprises a counter for altering the relative timing of the concurrent actions.

13. An integrated circuit chip as claimed in claim 1, wherein the variability circuitry comprises a linear-feedback shift register for altering the relative timing of the concurrent actions.

14. An integrated circuit chip as claimed in claim 1, wherein the variability circuitry comprises a pseudo-random number generator for altering the relative timing of the concurrent actions.

15. A method of functionality testing system circuitry on an integrated circuit chip, the system circuitry comprising a plurality of sub-circuits and the integrated circuit chip further comprising debugging circuitry, the debugging circuitry comprising variability circuitry, the method comprising:
    at the system circuitry, performing a function by the sub-circuits performing concurrent actions;
    at the variability circuitry, altering relative timing of the concurrent actions so as to increase the likelihood of one or more errors in the system circuitry's performance of the function, wherein the relative timing of the concurrent actions is altered by applying a delay to occurrences of a particular action of the concurrent actions by intercepting or delaying a communication through system circuitry; and at the debugging circuitry, recording one or more errors in the system circuitry's performance of the function.

16. A method as claimed in claim 15, comprising further altering the relative timing of the concurrent actions by applying jitter to the timing of the concurrent actions.

17. A method as claimed in claim 15, comprising applying the delay to every occurrence of the particular action of the concurrent actions.

18. A method as claimed in claim 15, comprising applying the delay to a proportion of the occurrences of the particular action of the concurrent actions.

* * * * *